US012800684B2

(12) United States Patent
Bollenbeck et al.

(10) Patent No.: US 12,800,684 B2
(45) Date of Patent: Nov. 17, 2026

(54) DIGITAL SENSOR WITH A HIGH DYNAMIC RANGE FOR MEASURING GRADIENT CURRENTS OF A MAGNETIC RESONANCE TOMOGRAPHY DEVICE AND MAGNETIC RESONANCE TOMOGRAPHY DEVICE HAVING SAID DIGITAL SENSOR

(71) Applicant: Siemens Healthineers AG, Forchheim (DE)

(72) Inventors: Jan Bollenbeck, Eggolsheim (DE); Michael Phung, Erlangen (DE); Franz Schork, Burgthann (DE); Henrik Zessin, Bubenreuth (DE); Reinhard Kramer, Erlangen (DE)

(73) Assignee: Siemens Healthineers AG, Forchheim (DE)

(*) Notice: Subject to any disclaimer, the term of this patent is extended or adjusted under 35 U.S.C. 154(b) by 141 days.

(21) Appl. No.: 18/908,331

(22) Filed: Oct. 7, 2024

(65) Prior Publication Data

US 2025/0138118 A1 May 1, 2025

(30) Foreign Application Priority Data

Oct. 25, 2023 (DE) ..................... 10 2023 210 506.3

(51) Int. Cl.

| | |
|---|---|
| ***G01R 33/385*** | (2006.01) |
| ***G01R 33/022*** | (2006.01) |
| ***G01R 33/36*** | (2006.01) |

(52) U.S. Cl.

CPC ....... *G01R 33/3852* (2013.01); *G01R 33/022* (2013.01); *G01R 33/3621* (2013.01)

(58) Field of Classification Search

None

See application file for complete search history.

(56) References Cited

U.S. PATENT DOCUMENTS

| | | | | |
|---|---|---|---|---|
| 5,270,657 | A * | 12/1993 | Wirth ................. | G01R 33/3852 324/318 |
| 11,193,999 | B2 * | 12/2021 | Boguslavskij ....... | G01R 33/543 |
| 2008/0204027 | A1 | 8/2008 | Luedeke et al. | |

(Continued)

FOREIGN PATENT DOCUMENTS

| | | | |
|---|---|---|---|
| CN | 211263742 | U * | 8/2020 |
| CN | 213544671 | U * | 6/2021 |
| EP | 3462203 | B1 | 11/2022 |

OTHER PUBLICATIONS

Reeder, Rob, Mark Looney, and Jim Hand. "Pushing the state of the Art with Multichannel A/D Converters." Analog Dialogue 39-05 (2005): 7-10.

(Continued)

*Primary Examiner* — Rodney E Fuller

(74) *Attorney, Agent, or Firm* — Lempia Summerfield Katz LLC

(57) ABSTRACT

A digital sensor with a high dynamic range is provided for measuring gradient currents of a magnetic resonance tomography device. The digital sensor has a first signal path and a second signal path arranged mutually parallel. The first signal path and the second signal path have different signal amplifications for the measurement signal that is fed in and an A/D converter for a digitization of the fed-in measurement signals.

16 Claims, 3 Drawing Sheets

(56) References Cited

U.S. PATENT DOCUMENTS

| | | | |
|---|---|---|---|
| 2015/0263750 | A1 | 9/2015 | Lenz |
| 2021/0011101 | A1 | 1/2021 | Boguslavskij |

OTHER PUBLICATIONS

Wikipedia—Chopper (electronics). Obtained Oct. 16, 2024. pp. 1-5. https://en.wikipedia.org/wiki/Chopper_(electronics).

Youtube. "DEWESOFT; SIRIUS DualCoreADC data acquisition technology with 160 dB dynamic range"; pp. 1-2. Release date: Apr. 10, 2018. https://www.youtube.com/watch?v=mzNyTn3W42s.

* cited by examiner

DIGITAL SENSOR WITH A HIGH DYNAMIC RANGE FOR MEASURING GRADIENT CURRENTS OF A MAGNETIC RESONANCE TOMOGRAPHY DEVICE AND MAGNETIC RESONANCE TOMOGRAPHY DEVICE HAVING SAID DIGITAL SENSOR

RELATED APPLICATION

This application claims the benefit of DE 10 2023 210 506.3, filed on Oct. 25, 2023, which is hereby incorporated by reference in its entirety.

FIELD

Independent of the grammatical term usage, individuals with male, female or other gender identities are included within the term.

The present document relates to a digital sensor with a high dynamic range for measuring gradient currents of a magnetic resonance tomography device and to a magnetic resonance tomography device having said sensor. The digital sensor has parallel signal paths for processing a measurement signal with different amplification, which receive a measurement signal from a signal divider. The signal paths have separate A/D converters for digitizing the measurement signal, wherein the first signal path and the second signal path each have an A/D converter for digitizing the fed-in measurement signals.

BACKGROUND

Magnetic resonance tomography devices are imaging apparatuses which, for mapping an examination object, align nuclear spins of the examination object with a strong external magnetic field and, by way of an alternating magnetic field, excite them into precession about this alignment. The precession and/or the return of the spin from this excited state into a state with lower energy itself generates an alternating magnetic field as the response, which is received via antennae.

With the aid of magnetic gradient fields, a position encoding is impressed upon the signals, which subsequently enables an association of the received signal with a volume element. The received signal is then evaluated, and a three-dimensional imaging representation of the examination object is provided. For receiving the signal, preferably local receiving antennae, so-called local coils, are used which, to achieve a better signal-to-noise ratio, are arranged directly on the examination object.

However, the gradient coils can also be used to compensate for inhomogeneities in the static magnetic field B0 or interferences by way of external stray fields. These deviations are similarly low as compared with the gradient fields. For example, in some magnetic resonance tomography devices, gradient currents through the gradient coils can amount to 1300 A, whereas corresponding compensation currents can be only 100 mA. For the digital acquisition and regulation of these currents, a higher dynamic range for the analog-to-digital converter (ADC) is therefore required in order, in the example set out above, to be able to map resultant current amplitude dynamics of 82 dB with an adequate signal-to-noise ratio (SNR). Particularly in phases with low or little gradient currents, the shim current can therefore no longer be set and monitored with the ADCs that are typically used for the control and monitoring of the actual gradient currents. The resulting digital noise reduces the effect of the B0 field inhomogeneity compensation and the achievable image quality.

In the publication DE 102019210107 A1 and/or U.S. Pat. No. 11,193,999 B2, an amplification and/or attenuation unit adjustable by a control unit of the magnetic resonance tomography device is proposed for the input signal of the ADC.

However, this requires a corresponding adaptation of the software for control of the magnetic resonance tomography device for the different phases of a sequence. A switch-over of the attenuation, for example, within an output of a gradient sequence also leads to signal jumps and/or transient processes and artifacts. In case of doubt, to avoid overloading the ADC and therefore faulty results, switching to a low amplification can take place early.

SUMMARY AND DETAILED DESCRIPTION

It is therefore an object to simplify and improve a shimming by the gradient coils.

The object is achieved with a digital sensor and a magnetic resonance tomography device with a digital sensor.

The digital sensor has a high dynamic range for the measurement of gradient currents of a magnetic resonance tomography device. Its dynamic range can be 82 dB or more, as set out in the introduction, with a combined use of the gradient coils, including for the shimming. Therein, the sensor can itself be a measuring unit for the currents, for example, a shunt or a measuring probe or can be fed their signals as an input signal.

The digital sensor has at least two signal paths, a first signal path and a second signal path. The signal path should be understood to be all the stages of the analog and digital signal processing that a measurement signal passes through from the input to the output of the processed, in particular, digitized measurement signal. A differential signal processing is therein regarded as a signal path.

The first signal path and the second signal path run in parallel. This should be understood to mean that both signal paths receive the same measurement signal as the input signal and the digital sensor outputs an output signal processed alternatively by way of the first signal path or the second signal path. The input signal of the first signal path and of the second signal path is derived by a signal divider from a single measurement signal. The measurement signal is applied identically without further processing to the first signal path and the second signal path.

It is conceivable, however, that a signal divider outputs the measurement signal altered, via different resistors or other means via the branches of the signal divider, in particular in its amplitude. In such a case, the corresponding elements of the signal divider are assigned to the respective signal path. Therefore, the measurement signal is always applied with the same amplitude to the input and/or start of the signal path.

The first signal path and the second signal path have different signal amplifications for the measurement signal that is fed in. The signal amplification is also taken to mean a signal amplification with a value smaller than one and/or having a negative value on the dB scale, which is also referred to as attenuation. Exemplary dB values for different signal amplifications are given below.

Also conceivable are filters in the signal paths to favor, for example, spectral regions, in particular, to suppress high-frequency interfering signal portions that are not relevant for the regulation of the shim currents.

The first signal path and the second signal path each have an A/D converter (ADC) for digitizing the measurement signals fed in and pre-processed at least with regard to amplitude. Preferably, the ADC is identical in both the signal paths to provide the same frequency behavior, temperature drift, etc.

It is also conceivable to use an ADC in time multiplex for both signal paths.

The ADCs each digitize the pre-processed measurement signals of both signal paths and make them available in digital form at their outputs.

The digital sensor further has a selection logic system. The selection logic system is configured to select and pass on one of the digitized measurement signals for further processing. The selection takes place dependent upon the amplitude of the measurement signal. Preferably, if the measurement signal has a low amplitude, the signal of the signal path with greater signal amplification is selected and, in a case of large amplitudes, the signal from the signal path with the lower signal amplification is selected. Details of how the selection can be realized and further possibilities for the selection are given below.

The selection logic can be realized, for example, by way of a hardware logic system, a field programmable gate array (FPGA), or a program in a general processor or a signal processor.

In an advantageous manner, the selection of a signal path can improve the quality of the sensor signals in that, for example, in the case of large measurement signals, an overloading is prevented by the small amplification and, in the case of small measurement signals, the resolution is improved by way of the greater amplification.

The magnetic resonance tomography device has a gradient coil and a gradient control system for generating magnetic field gradients in the context of the image acquisition sequences. The gradient control system of the magnetic resonance tomography device is also configured, by way of small currents as compared with the gradient currents, to compensate at least partially not only for transient inhomogeneities, but also optionally for static or temporary inhomogeneities, with continuous DC currents and/or shim currents in the static B0 magnetic field. Therein, by the digital sensor, the currents through the gradient coil(s) are acquired in pauses without gradients, where relevant, alone and/or during gradients as an additional portion of the currents for gradient generation. The acquisition by the digital sensor is part of a control and/or regulating process for control of the shimming and of the gradients.

The magnetic resonance tomography device benefits therein from the greater dynamic range of the digital sensor, which permits a more exact and improved control of the shim currents in all phases of the sequences.

Further advantageous embodiments are disclosed below.

In a possible embodiment of the digital sensor, the selection logic is further configured to scale the output signal dependent upon the selected signal path such that the output signal is linear over an entire measurement range of the sensor. In other words, the selection logic scales the output value of at least one of the A/D converters so that a gradient of a characteristic line in which the output values of the selection logic plotted in relation to the measurement values is constant over the entire value range of the measurement values to be acquired, regardless of whether the measurement values have been acquired via the first signal path or the second signal path. It is further conceivable that the selection logic provides the scaled output values of at least one A/D converter with an offset so that the output values of the selection logic for continuously changing measurement signals are also continuous.

The entire measurement range is regarded as being a value range of the measurement signals from a least significant bit (LSB) of the ADC for the first signal path with the greater signal amplification to all the set bits of the ADC for the second signal path with the smaller amplification, in other words, the entire value range between minimum resolution and overloading.

Scaling is taken here to mean the multiplication of the output value of the ADC(s) with a preferably constant factor. If, for example, the amplification factor of the second signal path is lower by 6 dB, that is, for an identical measurement signal at the input of the second signal path, therefore at the input of the ADC, supplies, for example, only half the voltage, preferably the output values of the ADC for the second signal path are multiplied by a factor of two and/or are shifted by one place to the left so that, for the scaled digital measurement signal, the voltage values for both signal paths corresponding to the LSB (after scaling) are identical. In other words, by way of the scaling, it is ensured that the value changes of the ADC for both signal paths at least for multiples of the LSB of the ADC of the first signal path is identical.

It is to be regarded as continuous if, with a continuous and sufficiently slowly rising measurement signal, the value following the selection logic changes in each case only by not more than a value corresponding to an LSB of the ADC of the second signal path with the lower signal amplification. In other words, the digital output signal of the selection logic makes no jumps greater than an LSB multiplied by the scaling factor if the measurement signal changes continuously and sufficiently slowly. This relates, in particular, to the switch-over between the A/D converter of the first signal path and of the second signal path, wherein the selection logic generates an output signal that is continuous and has no jumps, but changes only by a value corresponding to the scaled value of the lowest-value bit.

The constancy can be achieved, for example, in that one or both offset voltages of the ADC(s) are set such that for a pre-determined measurement signal, the scaled values of the ADC and/or the output values of the ADC for the first signal path and the scaled output value of the ADC for the second signal path match one another. Preferably, for measurement signals smaller than or equal to the predetermined measurement signal, the selection logic then selects the output values of the ADC for the first signal path and for measurement signals thereabove, scaled output values of the ADC for the second signal path.

Advantageously, the scaling together with the constancy provide that after the selection logic, a linear and continuous measurement value from the digital sensor is available for the measurement signal, which for small measurement signals has a high resolution and a better SNR and simultaneously for relatively larger measurement signals, an expanded dynamic range, although with lower resolution.

In one embodiment of the digital sensor, the selection logic is configured to establish a scaling factor and/or the offset dependent upon output values of the A/D converter of the first signal path and of the second signal path. The selection logic receives the digital measurement signals of both signal paths in parallel or, in an optional solution with an A/D converter in time multiplex, immediately one after the other, so that at least as far as a saturation of the first signal path, digitized measurement signals are available for both signal paths for the same input value of the digital sensor. For example, on the basis of at least two different digitized measurement signals of both signal paths, a rise in a characteristic line can be determined for both signal paths. The difference in the gradient, i.e., by way of a quotient of the gradient, the selection logic itself can establish the scaling factor that leads to a continuous gradient of the combined signals. The parallel displacement and/or difference in the scaled characteristic line portions for a common digital output value of both ADCs from a measurement signal at the input of the digital sensor then specifies a value for the offset that is to be added.

In an advantageous manner, the digital sensor with the selection logic can itself also adapt the interaction of the ADCs of the two signal paths and/or monitor and correct them during ongoing operation, for example, if pre-set values are no longer suitable due to ageing.

In particular, if the scaling and the offset take place transparently for the magnetic resonance tomography device, then no changes need to be made to the evaluating software. The transition between the two regions also takes place continuously and thus without artifacts, so that the transition between the value ranges can also take place within a sequence.

In a possible embodiment of the digital sensor, a signal amplification of the first signal path is greater by at least 3 dB, 6 dB, 12 dB or 18 dB than a signal amplification of the second signal path.

In an advantageous manner, the greater amplification increases the dynamic range of the digital sensor. In particular, the respective doubling of the amplification as a multiple of 6 dB simplifies the further processing in that it corresponds to a multiplication by two and/or a displacement of the digital value by one bit to the left.

In a conceivable embodiment of the digital sensor, the selection logic is configured to select the measurement signal of the second signal path when the measurement signal exceeds a predetermined threshold value. Preferably, the threshold value corresponds to an amplitude of the measurement signal at which the ADC of the first signal path assumes a maximum value, i.e., all bits set, at least the higher-value bits are set, or the highest value bit is set.

In an advantageous manner, the threshold value ensures that the high resolution of the ADC is utilized as far as possible with the high preamplification, and, simultaneously, an overloading at the output is prevented by way of the timely use of the other ADC with a higher dynamic response.

In a possible embodiment of the digital sensor, the first signal path has an amplitude limiter. A circuit which prevents preprocessed measurement signals of the first signal path applied to the input of the ADC from exceeding a maximum predetermined threshold value is regarded as an amplitude limiter. This can occur, for example, in that the amplification is reduced or the value is set, for example, by way of a switch to a predetermined value.

The maximum predetermined threshold value is preferably smaller than the maximum input value preprocessed by the ADC.

Advantageously, the amplitude limiter ensures that the ADC causes no interference to the subsequent signal processing and is not damaged itself.

The above-described properties, features and advantages of this invention and the manner in which they are achieved are made more clearly and distinctly intelligible with the following description of the exemplary embodiments which are set out in greater detail making reference to the drawings.

DETAILED DESCRIPTION

Figure 1:
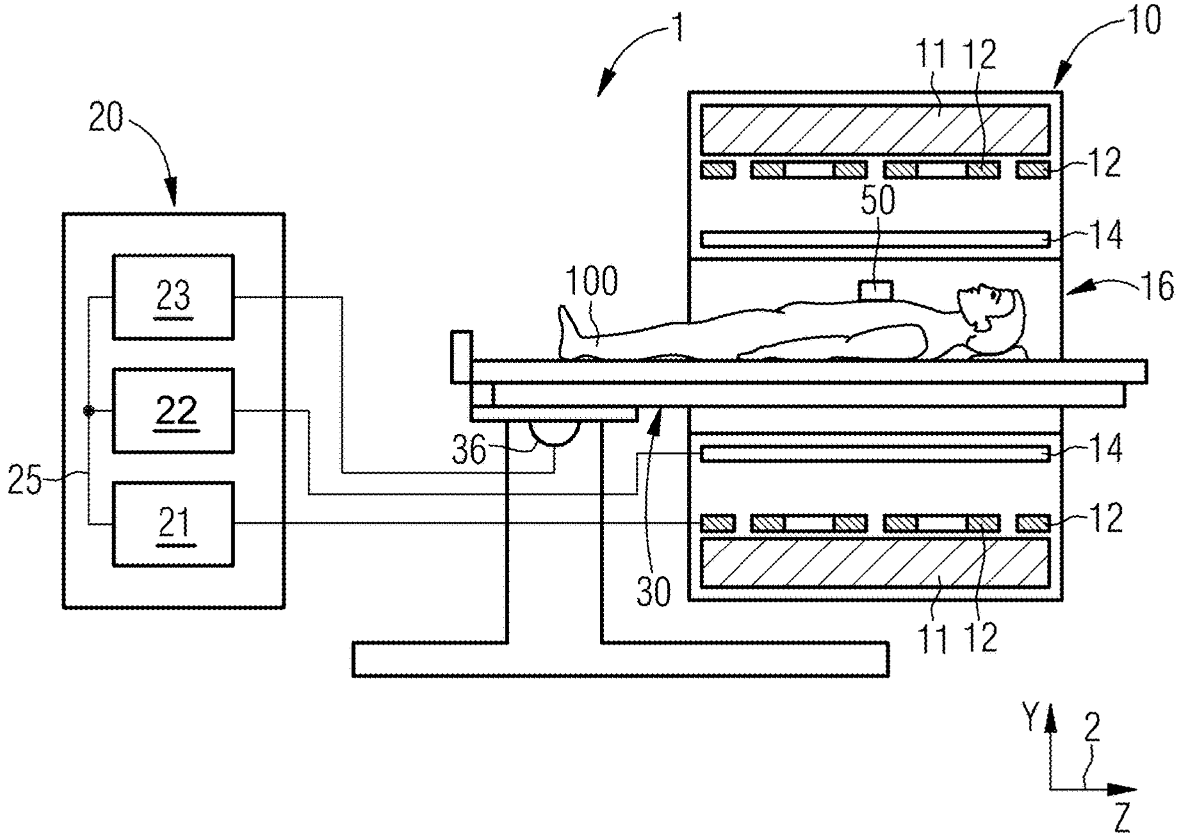
FIG. 1 shows a schematic representation of a magnetic resonance tomography device according to an embodiment.

FIG. 1 shows a schematic representation of an exemplary embodiment of a magnetic resonance tomography device 1.

The magnet unit 10 has a field magnet 11, which generates a static magnetic field B0 for aligning the nuclear spins of samples and/or patients 100 in a scanning region. The scanning region is arranged in a patient tunnel 16, which extends in a longitudinal direction 2 through the magnet unit 10. A patient 100 is movable by the patient table 30 and the positioning unit (motor and track) 36 of the patient table 30 into the scanning region. Typically, the field magnet 11 is a superconducting magnet, which can provide magnetic fields with a magnetic flux density of up to 3 T and in the newest devices even higher. For lower field strengths, however, permanent magnets or electromagnets with normally-conducting coils can also be used.

The magnet unit 10 further includes gradient coils 12, which are designed, for spatial differentiation of the acquired mapping regions in the examination volume, to overlay variable magnetic fields onto the magnetic field B0 in three spatial directions. The gradient coils 12 are typically coils made of normally conducting wires, which can generate mutually orthogonal fields in the examination volume.

The magnet unit 10 also has a body coil 14, which is configured to emit a high frequency signal fed via a signal line 33 into the examination volume and to receive resonance signals emitted from the patient 100 and to pass them on via a signal line. Preferably, however, the body coil 14 is replaced, for the emission of the high frequency signal and/or the reception, by local coils 50, which are arranged in the patient tunnel 16 close to the patient 100. It is also conceivable, however, that the local coil 50 is configured for transmitting and receiving and therefore a body coil 14 can be omitted.

A control unit (controller, processor, computer, or circuit) 20 supplies the magnet unit 10 with the different signals for the gradient coils 12 and the body coil 14 and evaluates the received signals. A magnetic resonance tomography device control system (controller, processor, computer, or circuit) 23 thereby coordinates the subsidiary units.

Thus, the control unit 20 includes a gradient controller (controller, processor, computer, or circuit) 21, which is configured to supply the gradient coils 12 via feed lines with variable currents which provide the desired gradient fields in the examination volume in a temporally coordinated manner.

Furthermore, the control unit 20 has a high frequency unit (transceiver or circuit) 22, which is configured to generate a high frequency pulse with a pre-determined temporal pattern, amplitude and spectral power distribution for the excitation of a magnetic resonance of the nuclear spins in the patient 100. Therein, pulse power levels in the kilowatt range can be achieved. The individual units are connected to one another via a signal bus 25.

The high frequency signal generated by the high frequency unit 22 is fed via a signal connection to the body coil 14 and is emitted into the body of the patient 100 to excite the nuclear spins there. Also conceivable, however is an emission of the high frequency signal via one or more local coils 50.

The local coil 50 then preferably receives a magnetic resonance signal from the body of the patient 100 since, due to the small distance, the signal-to-noise ratio (SNR) of the local coil 50 is better than with a reception by the body coil 14. The MR signal received by the local coil 50 is processed in the local coil 50 and passed on to the high frequency unit 22 of the magnetic resonance tomography device 1 for evaluation and image acquisition.

The quality of a mapping by a magnetic resonance tomography device 1 depends upon the homogeneity of the static magnetic field B0. It is influenced firstly by design features, although dynamic changes caused by the environment or temporally variable changes, for example, by way of external fields also occur.

In part, such fields are also compensated for by dedicated so-called shim coils, which are arranged in the environment of the image acquisition region and generate opposing magnetic fields with a DC current.

However, it is provided in the magnetic resonance tomography device 1 that for homogenizing the B0 field, the gradient coils 12 have low-frequency currents and/or DC currents in addition to the transient gradient currents flowing through them for homogenization. Therein, gradient currents can have strengths of up to 1000 A or more, whereas the strength of the compensation currents and/or shim currents can be less than 1 A or 100 mA. Due to the partially transient properties of the interference fields, the shim currents must be acquired and regulated in real time. However, current sensors of the gradient control systems 21 of conventional magnetic resonance tomography devices 1 are not configured for these large dynamic ranges. The digital sensor 60, which is described below in greater detail making reference to the attached drawings, advantageously provides a current sensor that has a high dynamic range with a high resolution in the region of the small shim currents and a high dynamic range with a high maximum adjusting capability for the high gradient currents.

Figure 2:
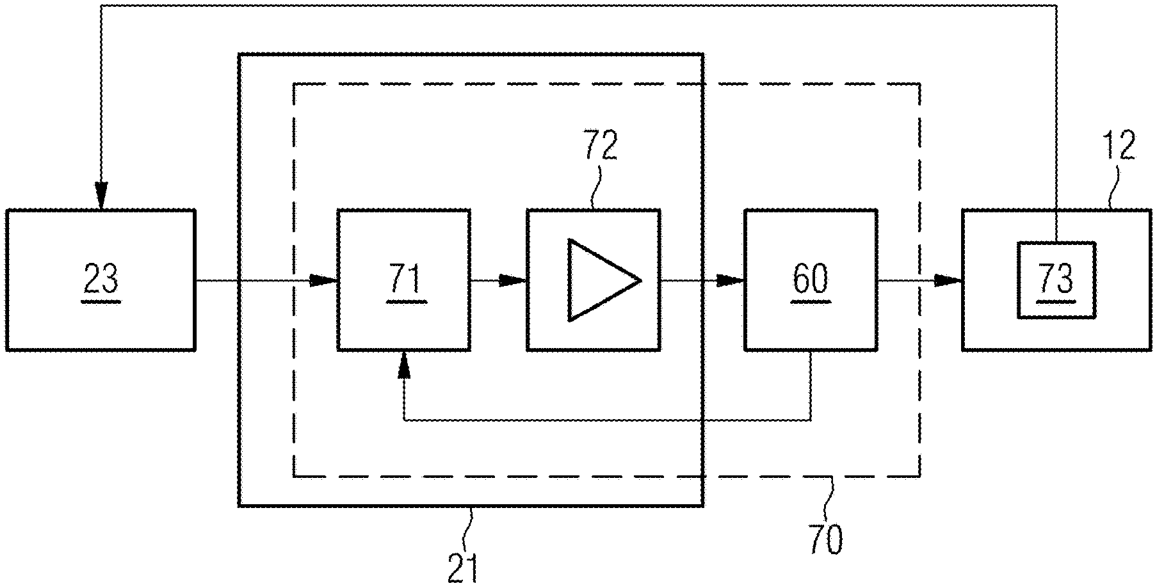
FIG. 2 shows a schematic representation of a drive system of a gradient coil of a magnetic resonance tomography device according to an embodiment.

Shown schematically in FIG. 2 is the drive system of a gradient coil 12 of a magnetic resonance tomography device 1. The control system (controller) 23 specifies to the gradient control system 21 the target values 71 for the magnetic fields to be generated by the gradient coils 12 during an image acquisition sequence, for example, with a value which specifies the current that is to be set through the gradient coil 12.

It is therein conceivable that a magnetic field sensor 73 of the control system 23 supplies a measurement value for the magnetic field B0 and/or its homogeneity in the image acquisition region, and the control system 23 takes account of the measurement value when the control system 23 specifies the value for the magnetic fields to be generated by the gradient control system 21. The magnetic field sensor 73 can be, for example, a Hall sensor or some other sensor that acquires the magnetic field B0 directly. Also conceivable, however, is a measurement of the magnetic field B0 via an image acquisition, for example, in the form of a B0 field map that is established via the Larmor frequency of the nuclear spins.

It is also possible that the B0 field map is acquired in a calibration measurement with a phantom and is stored in the control system 23.

The gradient control system 21 converts the target values 71 by a gradient amplifier 72 into currents which are fed into the gradient coils 12. The currents are acquired by the digital sensor 60. For example, a shunt that converts the current into a proportional voltage, which is then acquired by the digital sensor 60 with a high resolution, can be provided in the line between the gradient amplifier 72 and the gradient coil 12. Also conceivable is, for example, a current probe that acquires the current via the magnetic field around the line.

The measurement value of the digital sensor 60 is fed to the gradient control system 21, which compares the measurement value of the digital sensor 60 with the target value for the current and corrects the signal output by the gradient control system 21 to the gradient amplifier 72 in order to set the current specified by the target value as accurately as possible. In this way, the gradient control system 21, the gradient amplifier 72 and the digital sensor 60 form a gradient setting circuit 70.

It is also conceivable that the digital sensor 60 passes on the measurement values for the current to the control system 23 and this then adapts the target value for correction, which is output by the control system 23 to the gradient control system 21, that is, the control system 23 is also included in the gradient setting circuit 70. The gradient setting circuit could also be extended to a magnetic gradient regulator circuit in that the control system 23 or the gradient control system 21 adapts the measurement values of the magnetic field sensor 73 and correspondingly adapts the target value.

Figure 3:
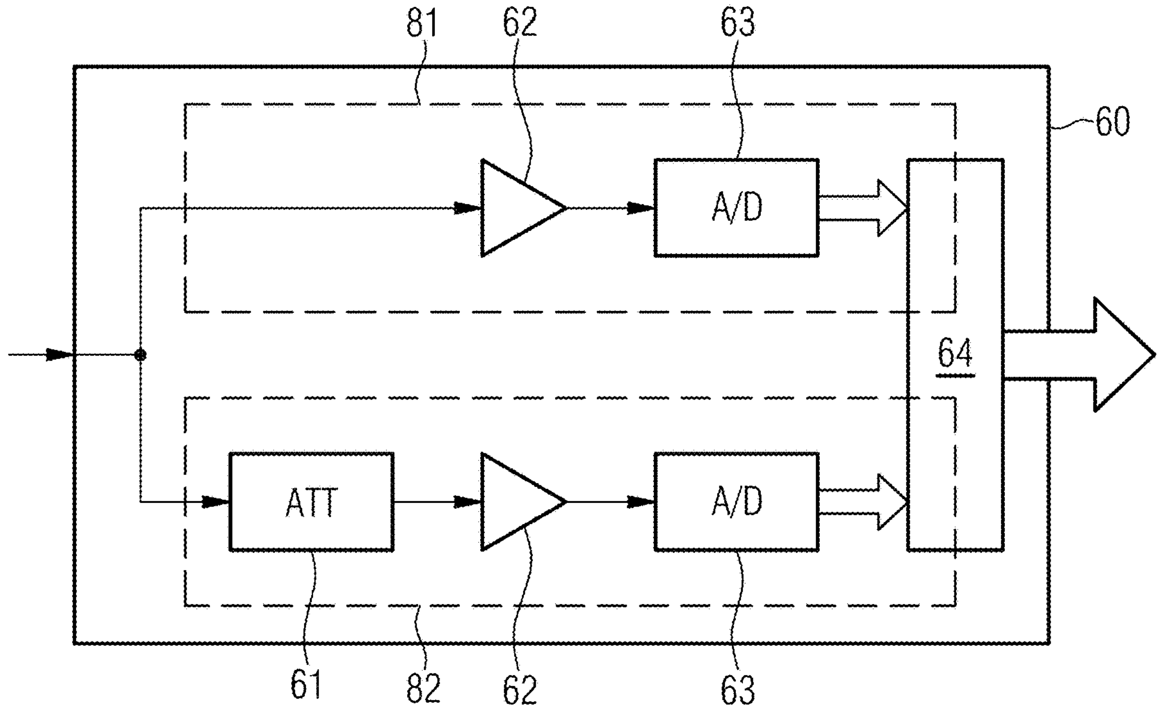
FIG. 3 shows a simplified schematic representation of a digital sensor according to an embodiment.

FIG. 3 shows a simplified schematic representation of a digital sensor 60. The analog measurement value, for example, a voltage or a current, is fed to the digital sensor 60 for acquisition and digitization. The signal is fed to two parallel signal paths 81, 82 in the digital sensor 60, a first signal path 81 and a second signal path 82. The measurement value is amplified differently in the branches, this being realized, in a possible embodiment, by the attenuation unit 61 in the second signal path 82. In the embodiment shown, the further signal processing is identical. The signal is amplified in both paths by an amplifier 62 and decoupled and subsequently digitized by the A/D converters 63. Subsequently, the digitized values are combined by a combination logic and/or selection logic (selector) 64 to a digital output signal of the digital sensor 60.

Figure 4:
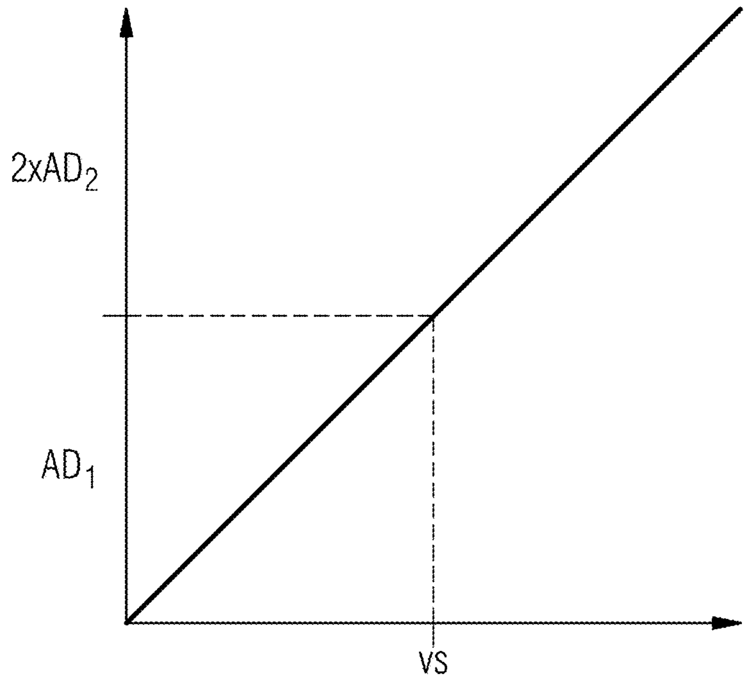
FIG. 4 shows schematically an exemplary relationship between a measurement signal and an output signal of a digital sensor.

It is shown in FIG. 4, in the form of a characteristic line, how the combination of the two signal paths 81, 82 takes place. The x-axis or abscissa gives the measurement value and/or input value of the digital sensor 60 in arbitrary units. The y-axis or ordinate gives the digital output value of the digital sensor. The representation is exemplary for a digital sensor 60, wherein the analog measurement value is amplified in the first signal path 81 by 6 dB more than in the second signal path 82.

The selection logic passes on, for small measurement values with which for the first signal path 81 saturation of the A/D converter 63 does not yet occur, the digital output values of the A/D converter 63 of the first signal path 81. By this means, the higher resolution at greater amplification is utilized.

From a predetermined threshold value VS which possibly lies in an upper value range of the A/D converter of the first signal path 81 just below saturation, the selection logic 64 takes the output values of the A/D converter 63 of the second signal path 82 as the basis of the output signal. For this purpose, the selection logic scales the output values of the A/D converter(s) 63 so that the combined output values after the selection logic rise continuously and linearly, in dependence upon the measurement signal, with linearly increasing measurement values at the input of the digital sensor 60. It is referred to as continuous if, with a continuously changing input signal, the output signal of the selection logic simultaneously changes, in each case, only by the value of the lowest-valued bit and/or, as described below, by a scaled value of the lowest-valued bit.

For this purpose, in the example of FIG. 4 with a difference in the amplification of the two signal paths 81, 82 of 6 dB, the digital output signal of the A/D converter 63 of the second signal path 82 is multiplied by the factor two. It is also conceivable that an offset from the selection logic 64 is added to create a constancy of the output signal of the selection logic at the switchover point between the A/D converter 63 of the first signal path 81 and the second signal path 82. In the example, for measurement signals above the switchover point, the resolution is then halved, although this is of less significance for the large values of the magnetic field acquired therewith during the transient gradients. For small magnetic fields, however, for example, for small magnetic field gradients and also in the lower part of the ramp-shaped course of large magnetic field gradients or in the phases of the sequence between the gradients, merely with the relatively low shim currents through the gradient coils, the measurement signal is reproduced with maximum resolution in the output signal of the selection logic 64.

It is therein conceivable that the selection logic 64 itself provides that the characteristic line shown in FIG. 4 extends continuously, that is, without jumps, and linearly, that is, with a constant gradient, over the entire region. Since the two A/D converters 63 of the first signal path 81 and of the second signal path 82 each simultaneously receive a substantially linearly derived measurement signal at least over a part of the value range from a common input signal of the digital sensor 60 for conversion, and convert them into digital values, the selection logic 64 can establish from two value pairs for each A/D converter 63, in each case, the gradient and the offset for both characteristic line segments and therefrom again establish an offset and a scaling factor by way of difference formation and/or quotient formation, with which the selection logic 64 can provide from the output values of the two A/D converters 63 an overall characteristic line having a continuous and constant gradient. The selection logic 64 can then also continuously adapt these values during ongoing operation, for example, to an ageing of the analog components.

The selection logic 64 can be realized, for example, by way of a hard-wired logic system (circuit), an FPGA, or a processor.

Figure 5:
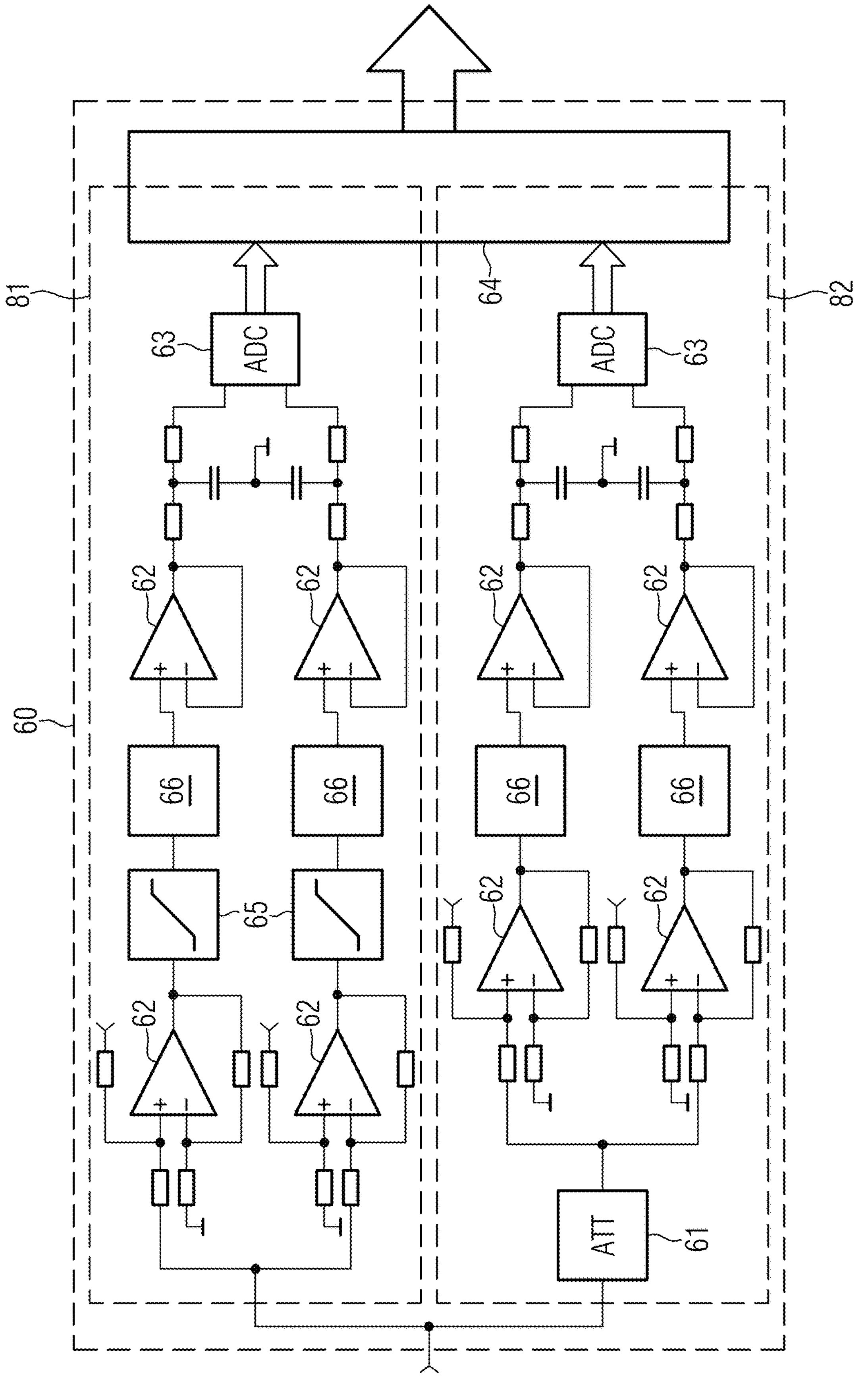
FIG. 5 shows an exemplary schematic representation of a digital sensor.

FIG. 5 shows an embodiment of the digital sensor 60 of FIG. 3, having further optional details.

In FIG. 5, the signal processing takes place differentially in the first signal path 81 and the second signal path 82.

The signal paths 81, 82 shown in FIG. 5 are composed of the following components, from the input of the measurement signal on the left to the output to the selection logic 64 on the right:

A low-noise amplifier 62 serves as a converter of the single-ended signal into a differential signal. Subsequently, in the first signal path 81, an inadmissible overloading of the subsequent components, including the A/D converter 63, is prevented by way of an amplitude limiter 65, when driving at levels that lie above a switchover threshold.

An anti-aliasing filter 66 limits the frequency response of the measurement signal and a low-noise amplifier 62 serves as an ADC driver and an interface filter.

The attenuation unit 61 drawn in the lower, second signal path 82 implies the reduced amplification compared with the first signal path. This can also be set by way of corresponding dimensioning of the amplifier 63.

Although the invention has been illustrated and described in detail by way of the preferred exemplary embodiment, the invention is not restricted by the examples disclosed and other variations can be derived herefrom by a person skilled in the art without departing from the protective scope of the invention.

The invention claimed is:

1. A digital sensor with a high dynamic range for measuring gradient currents of a magnetic resonance tomography device, the digital sensor comprising:

a first signal path;

a second signal path, wherein the first signal path and the second signal path are mutually parallel;

a signal divider configured to feed a measurement signal to be acquired with the digital sensor to both the first and second signal paths, wherein the first signal path and the second signal path have a different signal amplification for a respective measurement signal, and wherein the first signal path and the second signal path each have an analog-to-digital (A/D) converter configured to digitize the measurement signals; and a selector configured, dependent upon an amplitude, to select a digitized measurement signal from the first signal path or from the second signal path and to pass the selected digitized measurement, wherein the selector is further configured to scale the digitized measurement signal and/or to apply an offset thereto dependent upon the selected first or second signal path, such that the digitized measurement signal is continuous and linear over an entire measurement range of the digital sensor, which includes the measurement signals of the first signal path and of the second signal path.

2. The digital sensor of claim 1, wherein the selector is further configured to establish a scaling factor and/or the offset dependent upon output values of the A/D converters of the first signal path and of the second signal path.

3. The digital sensor of claim 2, wherein a signal amplification of the first signal path is greater by at least 3 dB than a signal amplification of the second signal path.

4. The digital sensor of claim 2, wherein the selector is further configured to select the digitized measurement signal of the second signal path when the digitized measurement signal exceeds a predetermined threshold value.

5. The digital sensor of claim 4, wherein the first signal path has an amplitude limiter configured to prevent an overloading of the A/D converter of the first signal path when a measurement value exceeds the predetermined threshold value.

6. The digital sensor of claim 1, wherein a signal amplification of the first signal path is greater by at least 3 dB than a signal amplification of the second signal path.

7. The digital sensor of claim 1, wherein the selector is configured to select the digitized measurement signal of the second signal path when the digitized measurement signal exceeds a predetermined threshold value.

8. A digital sensor with a high dynamic range for measuring gradient currents of a magnetic resonance tomography device, the digital sensor comprising:

a first signal path;

a second signal path, wherein the first signal path and the second signal path are mutually parallel;

a signal divider configured to feed a measurement signal to be acquired with the digital sensor to both the first and second signal paths, wherein the first signal path and the second signal path have a different signal amplification for a respective measurement signal, and wherein the first signal path and the second signal path each have an analog-to-digital (A/D) converter configured to digitize the measurement signals; and a selector configured, dependent upon an amplitude, to select a digitized measurement signal from the first signal path or from the second signal path and to pass the selected digitized measurement, wherein the selector is further configured to select the digitized measurement signal of the second signal path when the digitized measurement signal exceeds a predetermined threshold value, and wherein the first signal path has an amplitude limiter configured to prevent an overloading of the A/D converter of the first signal path when a measurement value exceeds the predetermined threshold value.

9. A magnetic resonance tomography device comprising:

a gradient coil; and a gradient control system configured to undertake a B0 field correction by a shimming current through the gradient coil; and a digital sensor comprising a first signal path, a second signal path, a signal divider, and a selector, wherein the gradient control system is configured to acquire a current through the gradient coil by the digital sensor, wherein the first signal path and the second signal path are mutually parallel, wherein the signal divider is configured to feed a measurement signal to be acquired with the digital sensor to both the first and second signal paths, wherein the first signal path and the second signal path have a different signal amplification for a respective measurement signal, wherein the first signal path and the second signal path each have an analog-to-digital (A/D) converter configured to digitize the measurement signals, wherein the selector is configured, dependent upon an amplitude, to select a digitized measurement signal from the first signal path or from the second signal path and to pass the selected digitized measurement, and wherein the selector is further configured to scale the digitized measurement signal and/or to apply an offset thereto dependent upon the selected first or second signal path, such that the digitized measurement signal is continuous and linear over an entire measurement range of the digital sensor, which includes the measurement signals of the first signal path and of the second signal path.

10. The magnetic resonance tomography device of claim 9, wherein the selector is further configured to establish a scaling factor and/or the offset dependent upon output values of the A/D converters of the first signal path and of the second signal path.

11. The magnetic resonance tomography device of claim 10, wherein a signal amplification of the first signal path is greater by at least 3 dB than a signal amplification of the second signal path.

12. The magnetic resonance tomography device of claim 10, wherein the selector is further configured to select the digitized measurement signal of the second signal path when the digitized measurement signal exceeds a predetermined threshold value.

13. The magnetic resonance tomography device of claim 12, wherein the first signal path has an amplitude limiter configured to prevent an overloading of the A/D converter of the first signal path when a measurement value exceeds the predetermined threshold value.

14. The magnetic resonance tomography device of claim 9, wherein a signal amplification of the first signal path is greater by at least 3 dB than a signal amplification of the second signal path.

15. The magnetic resonance tomography device of claim 9, wherein the selector is further configured to select the digitized measurement signal of the second signal path when the digitized measurement signal exceeds a predetermined threshold value.

16. The magnetic resonance tomography device of claim 15, wherein the first signal path has an amplitude limiter configured to prevent an overloading of the A/D converter of the first signal path when a measurement value exceeds the predetermined threshold value.

* * * * *